(12) United States Patent
Aleksov et al.

(10) Patent No.: US 9,526,285 B2
(45) Date of Patent: Dec. 27, 2016

(54) FLEXIBLE COMPUTING FABRIC

(71) Applicants: Aleksandar Aleksov, Chandler, AZ (US); Ravindranath V. Mahajan, Chandler, AZ (US); Sairam Agraharam, Chandler, AZ (US); Ian A. Young, Portland, OR (US); John C. Johnson, Phoenix, AZ (US); Debendra Mallik, Chandler, AZ (US); John S. Guzek, Chandler, AZ (US)

(72) Inventors: Aleksandar Aleksov, Chandler, AZ (US); Ravindranath V. Mahajan, Chandler, AZ (US); Sairam Agraharam, Chandler, AZ (US); Ian A. Young, Portland, OR (US); John C. Johnson, Phoenix, AZ (US); Debendra Mallik, Chandler, AZ (US); John S. Guzek, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 972 days.

(21) Appl. No.: 13/717,909

(22) Filed: Dec. 18, 2012

(65) Prior Publication Data

US 2014/0165269 A1   Jun. 19, 2014

(51) Int. Cl.
*H05K 1/02* (2006.01)
*H05K 3/30* (2006.01)
(Continued)

(52) U.S. Cl.
CPC ............ *A41D 31/00* (2013.01); *H05K 1/038* (2013.01); *H05K 1/188* (2013.01); *H05K 1/0274* (2013.01);
(Continued)

(58) Field of Classification Search
CPC .......... H05K 1/02; H05K 3/30; H05K 1/0277; H05K 3/303
(Continued)

(56) References Cited

U.S. PATENT DOCUMENTS 5,953,314 A     9/1999  Ganmukhi et al.
6,108,210 A *   8/2000  Chung .................. H01L 24/81
                                                     174/255

(Continued)

FOREIGN PATENT DOCUMENTS

CN      1783169 A      6/2006
TW      M406617        7/2011
(Continued)

OTHER PUBLICATIONS

International Search Report and Written Opinion received for PCT Patent Application No. PCT/US2013/073269, mailed on Mar. 21, 2014, 11 pages.
(Continued)

*Primary Examiner* — Eric Thomas
*Assistant Examiner* — Michael P McFadden
(74) *Attorney, Agent, or Firm* — Grossman, Tucker, Perreault & Pfleger, PLLC (57) ABSTRACT

A flexible computing fabric and a method of forming thereof. The flexible computing fabric includes an electronic substrate including one or more channels and including at least two ends. At least one computational element is mounted on the electronic substrate between the two ends and at least one functional element is mounted on the electronic substrate between the two ends. The channels form an interconnect between the elements. In addition, the electronic substrate is flexible and exhibits a flexural modulus in the range of 0.1 GPa to 30 GPa.

20 Claims, 11 Drawing Sheets

(51) Int. Cl.
*A41D 31/00* (2006.01)
*H05K 1/03* (2006.01)
*H05K 1/18* (2006.01)
*H05K 3/32* (2006.01)
*H05K 3/34* (2006.01)

(52) U.S. Cl.
CPC ............ *H05K 3/323* (2013.01); *H05K 3/3436* (2013.01); *Y10T 29/4913* (2015.01)

(58) Field of Classification Search
USPC .............................................. 361/748; 1/748
See application file for complete search history.

(56) References Cited

U.S. PATENT DOCUMENTS

| | | | |
|---|---|---|---|
| 6,270,466 B1* | 8/2001 | Weinstein | A61B 5/0488 600/590 |
| 6,307,751 B1 | 10/2001 | Bodony et al. | |
| 6,429,431 B1 | 8/2002 | Wilk | |
| 6,622,220 B2 | 9/2003 | Yoshida et al. | |
| 6,628,662 B1 | 9/2003 | Blackmon et al. | |
| 7,353,362 B2 | 4/2008 | Georgiou et al. | |
| 8,190,699 B2 | 5/2012 | McMillian et al. | |
| 8,234,435 B2 | 7/2012 | Yoshida et al. | |
| 8,325,194 B1 | 12/2012 | Mrazek et al. | |
| 8,340,088 B2 | 12/2012 | Sindhu et al. | |
| 8,799,697 B2 | 8/2014 | Johnson et al. | |
| 8,843,682 B2 | 9/2014 | Nemawarkar | |
| 8,886,899 B1 | 11/2014 | Bao | |
| 8,904,115 B2 | 12/2014 | Chachad et al. | |
| 2002/0180809 A1 | 12/2002 | Light et al. | |
| 2005/0097300 A1 | 5/2005 | Gildea et al. | |
| 2006/0068576 A1 | 3/2006 | Burdick et al. | |
| 2006/0182297 A1* | 8/2006 | Cyr | A41D 1/005 381/333 |
| 2006/0280322 A1* | 12/2006 | Abe | H01R 13/24 381/300 |
| 2009/0133898 A1* | 5/2009 | Kojima | H01B 13/01254 174/117 F |
| 2010/0085720 A1* | 4/2010 | Shudo | H01R 12/57 361/792 |
| 2010/0100997 A1* | 4/2010 | Lee | H01R 13/2407 2/69 |
| 2010/0325388 A1 | 12/2010 | Howard | |
| 2011/0106522 A1 | 5/2011 | Chinya et al. | |
| 2011/0236662 A1* | 9/2011 | Fukuda | B32B 27/08 428/216 |
| 2012/0212904 A1 | 8/2012 | Fleming et al. | |
| 2014/0040528 A1 | 2/2014 | Chang et al. | |
| 2014/0075082 A1 | 3/2014 | Coleman et al. | |
| 2014/0282819 A1 | 9/2014 | Sastry et al. | |

FOREIGN PATENT DOCUMENTS

| | | |
|---|---|---|
| TW | M428394 | 5/2012 |
| WO | 2012/101514 A2 | 8/2012 |

OTHER PUBLICATIONS

Intel, "Intel Atom Processor Z2760," Datasheet, Revision 1.0, Oct. 2012, 150 pages.
Taiwan Office Action received for Taiwan Patent Application No. 102141049, mailed Mar. 3, 2016, 6 pages of English translation and 6 pages of Taiwan Office Action.
Office Action received for Taiwan Patent Application No. 102141049, mailed on Oct. 2, 2015, 10 pages of English translation and 10 pages of Taiwanese Office Action.
International Preliminary Report on Patentability received for PCT Application No. PCT/US2013/073269, mailed on Jul. 2, 2015, 8 pages.

* cited by examiner

FLEXIBLE COMPUTING FABRIC

FIELD

The present disclosure relates to a flexible computing fabric and related methods.

BACKGROUND

Integrating electronics into clothing or accessories has been identified as a mechanism to augment sensing, communication, or entertainment. For example, such integrated electronics may be utilized to compliment a user's gaming experience, improve patient health monitoring, or provide readily available control functionality to a user. However, improvements in implementing flexible systems while maintaining desirable hand, and particularly desirable flexibility, in the fabric still remain.

BRIEF DESCRIPTION OF THE DRAWINGS

The above-mentioned and other features of this disclosure, and the manner of attaining them, may become more apparent and better understood by reference to the following description of embodiments described herein taken in conjunction with the accompanying drawings, wherein:

FIG. 5b illustrates the electrical substrates of FIG. 5a;

FIG. 5c illustrates a cross-sectional view, taken at section A-A of the electrical substrate of FIG. 5a;

FIG. 7b illustrates a bonded die, bonding layer and electrical substrate of FIG. 7a;

DETAILED DESCRIPTION

The present disclosure relates to a flexible computing fabric, a wearable garment or accessory including such fabric and related methods. As noted above, flexible computing fabric may be utilized in a variety of applications for the purposes of augmenting sensing, communication or entertainment. The flexible computing fabric herein provides modular electronics integration into clothing or accessories. Flexible is understood herein as being capable of multiple deformations, i.e., capable of bending or torsion around one or more axis, upon the application of a force.

Figure 1:
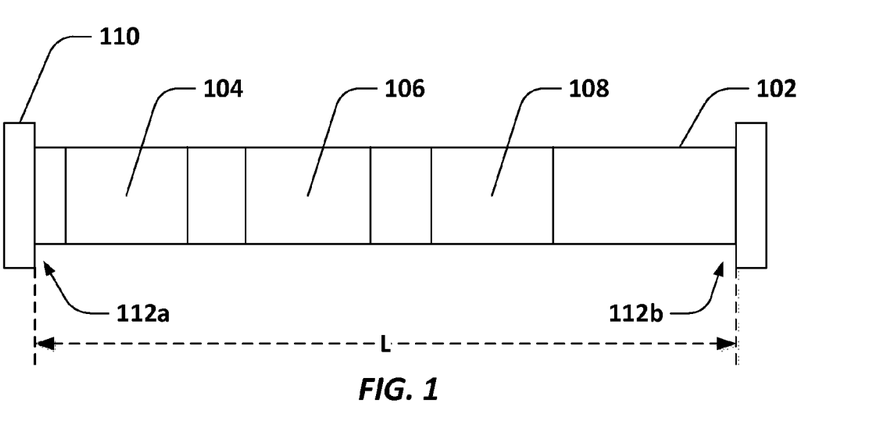
FIG. 1 illustrates an embodiment of flexible computing fabric.

FIG. 1 illustrates an embodiment of an implementation of the flexible computing fabric. The computing fabric 100 utilizes an electronic substrate 102 serving as an interconnect between a plurality of elements, such as computational elements 104, memory elements 106, and other functional elements (collectively 108). At least one computational element is present and at least one functional element is present.

These elements are mounted to or integrated into the electronic substrate 102 through electrical connections, optical connections, mechanical connections or a combination thereof. However, the elements are also modular, which is understood such that the various elements are designed and formed separately from the electronic substrate. Thus, the design of the flexible computing fabric can be altered without having to alter the individual elements, but through addition and subtraction of elements from the substrate. The electronic substrate 102 provides power, communication or both as between the various elements. In addition, connectors 110 are mounted to the electronic substrate at one or more ends 112a, 112b of the electronic substrate 102, as well as, along any other portion of the length L of the electronic substrate 102. In embodiments, the elements and connectors are release-ably affixed to the electronic substrate, such that the elements and connectors may be removed, added or interchanged with other elements or connectors.

In embodiments, the electronic substrate 102 includes an interconnect cable having, for example, from 1 to 99 conductors or channels, including all values and ranges therein, such as 3 to 10 conductors, 20 to 50 conductors, etc. In embodiments, the interconnect cable is a ribbon cable exhibiting, for example, flat, twisted pair flat, or twin axial configurations. The interconnect cable exhibit, Pitch between the channels is in the range of 0.25 mm to 2.54 mm, including all values and ranges therein. The channels are formed from round wire, flat wire, printed conductors or conductive foil. Each channel provides power, communication, or both as between the various die elements. In embodiments, the cable is formed from a conducting wire and an insulative polymer film. Conducting wire may include, for example gold, silver, copper, etc. The polymer film may include poly(vinyl chloride), polyethylene, polypropylene, polyurethane, poly(vinylidene fluoride), ethylene chlorotrifluoroethylene, poly(ethylene-co-tetrafluoroethylene), fluorinated ethylene propylene, tetrafluoroethylene, etc. The ratio of conductor to polymer may be in the range of 1:1 to 1:10, including all values and ranges therein.

The electronic substrate also or alternatively includes, flexible printed circuits, i.e., conductors (or passive wiring structures) printed on a polymer film, such as polyethylene terephthalate, polyimide, or polyether ether ketone. The electronic substrates include one or more layers of circuitry. Where more than one layer of circuitry is present, the various layers may be electrically connected to provide communication between the layers.

The electronic substrate is deformable, that is capable of bending or torsion around one or more axis. In embodiments, the electronic substrate may also be stretchable, allowing for deformation and elastic recovery of the substrate, wherein the electronic substrate is configured to retain at least 50% of its original dimensions upon recovery, up to 99% of its original dimensions upon recovery. The stiffness, or flexibility, of the material may be quantified using a number of indicators, such as bending radius, flexural modulus, or both.

Figure 2:
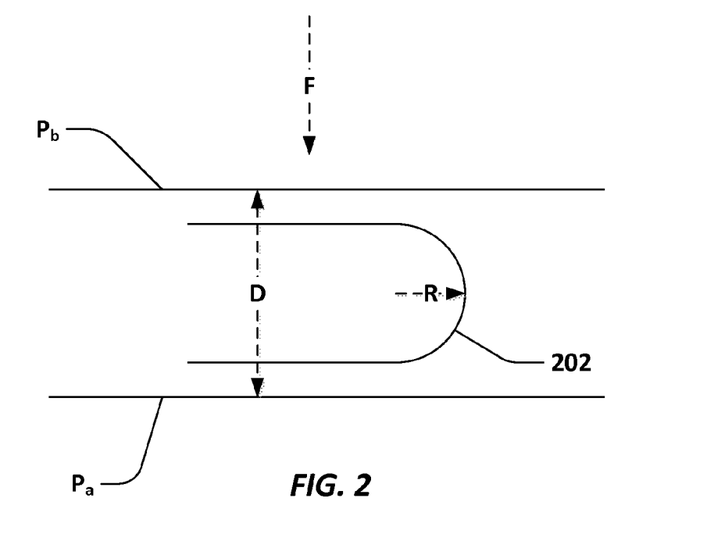
FIG. 2 illustrates a schematic of a bending radius test set-up.

Accordingly, in embodiments, the electronic substrate exhibits a bending radius of less than 5 mm, including all values and ranges from 0.1 mm to 5 mm. including 0.2 mm to 10.0 mm, etc. Bending radius, or radius of bending, is understood as the minimum radius the substrate can be bent without damage. In embodiments, bending radius is measured as illustrated in FIG. 2. A sample 202 is loaded between two parallel plates $P_a$, $P_b$ and a force ($F_1$) is applied to the plates reducing the distance (D) between the plates. As the plates approach one another the bending radius (R) is reduced. The smaller the bending radius achieved prior to material failure, the more relatively flexible the material is. In addition, or alternatively, the electrical substrate exhibits a flexural modulus of 30 GPa or less, including all values and ranges between 0.1 to 30 GPa. Such as less than 20 GPa, in the range of 0.1 GPa to 15 GPa, 0.04 GPa to 1.0 GPa, 8 GPa to 10 GPa, etc. The flexural modulus may be measured using ASTM D790-10.

Referring again to FIG. 1, computational elements 104 encompass computational logic, such as integrated circuits, that integrate one or more functions including processing using microprocessor, microcontroller, or digital signal processor; memory using random access memory, read only memory, or flash memory; timing functions using oscillators or phase-locked loops; external interfaces using universal serial bus, FireWire, ethernet, universal asynchronous receiver/transmitter, or serial peripheral interface; analog-digital interfaces using analog to digital converter or digital to analog converter; voltage regulators; and power management circuits. Memory elements 106 encompass, for example, flash memory, optical memory, magnetic memory, etc.

Other functional elements 108 are incorporated herein as well that provide additional functionality such as sensing various conditions, providing motion or actuation, or providing communication. These elements include sensors and actuators (collectively 108) such as, for example, audio sensors such as a microphone, chemical sensors such as chemical or ion field-effect transistor, accelerometer, charge-coupled devices, temperature sensor, infra-red sensor, photodetector, proximity sensor, capacitance sensors, switches, etc. Other additional functional elements include wireless radios, i.e., transmitters, receiver or transceivers, and other components may also be integrated into the circuitry. While the other elements are illustrates as being positioned on a single die, more than one die, each having or being configured to provide a given functionality or functionalities, may be provided.

In addition, connectors 110 to join, configured to join, or joining, one or more of channels of the electrical substrate to external components, which include input devices, output devices, a power supply and combinations thereof. Such external components include displays; cameras; input devices including mouse, keyboard or other sensors; interfaces to power supplies such as batteries, fuel cells, outlets/transformers, solar cells, etc., encompass electrical-mechanical devices. Therefore, the contacts may include electrical or optical contacts. The connectors may be selected to include a sufficient number of contacts to match a desired number of conductors or channels and pitch of the channels. The connectors may be selected such that all of or less than all of the channels of a given electronic substrate are coupled with the connector. In embodiments, the connector housing, or the portion of the connector carrying the contacts that mate with the channels of the electronic substrate, are flexible and capable of deformation, i.e., capable of bending or torsion around one or more axis. The connector housing may exhibit a flexural modulus of 30 GPa, or less, such as in the range of 0.1 GPa to 15 GPa, including all values and increments therein. Such as in the range of 0.04 GPa to 1.0 GPa, 8 GPa to 10 GPa, etc.

In embodiments, the connectors may also be stretchable, allowing for deformation and elastic recovery of the substrates, wherein the connectors are configured to deform upon the application of a load and to retain at least 50% of its original dimensions upon recovery and up to 99% of its original dimensions upon recovery, including all values and ranges therein. Due to the flexibility of such connectors a fixture may be used to facilitate connection of the contacts to the channels of the electronic substrate.

Figure 3:
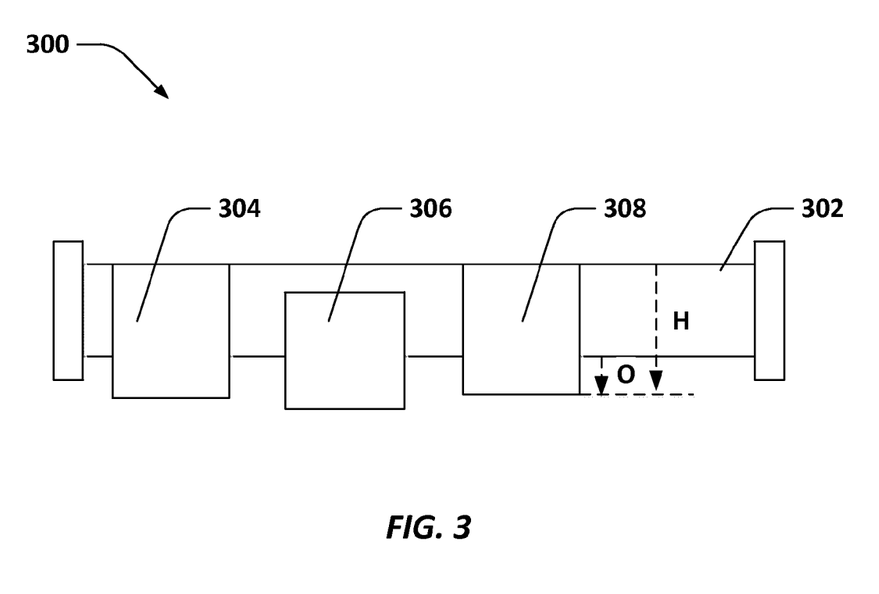
FIG. 3 illustrates another embodiment of a flexible computing fabric.

As illustrated in FIG. 3, the width of the dies supporting the various elements on the flexible computing fabric 300, (i.e., the computational element 304, memory element 306 and function element 308,) overhang the electronic substrate 302, by a distance (O). In embodiments, the overhang "O" is up to 75% of the total height (H) of the connector. Further, while it is illustrated in FIG. 1 that all of the dies the same width and are the same width as the electronic substrate 302, FIG. 3 illustrates that the individual dies overhang the electronic substrate and exhibit different widths. In addition, while FIGS. 1 and 3 illustrate only a single memory element, computational logic element and functional element positioned on the electronic substrate, more than one type of element or die, such as two memory dies, two computational logic dies, etc., may be present. Furthermore, like the connectors, the dies are also flexible in embodiments, being formed, for example on polymeric films. That is, in embodiments, the dies may have a flexural modulus of less than 30 GPa, as measured by ASTM D790-10, including all values and ranges from 0.1 GPa to 15 GPa.

Figure 4:
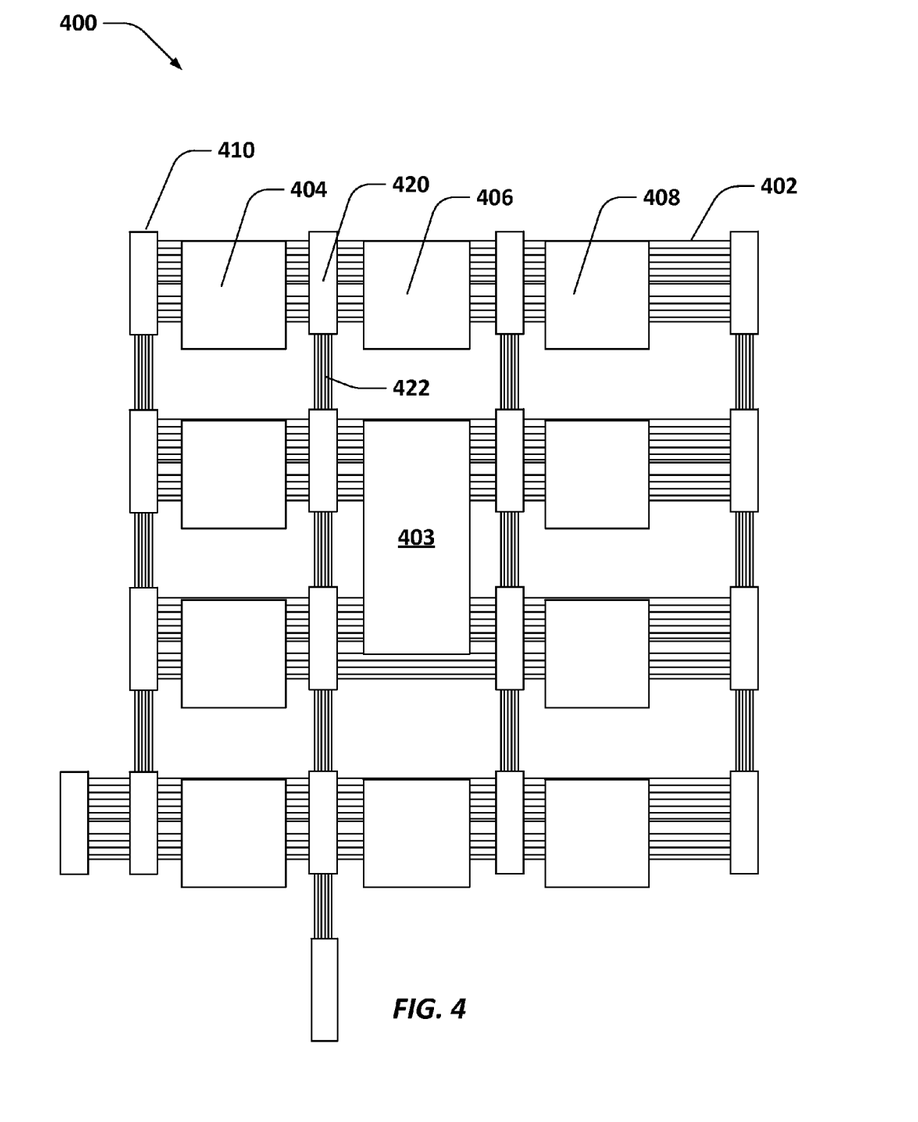
FIG. 4 illustrates an embodiment of a two-dimensional computing fabric.

The above describes a one-dimensional matrix of elements that encompass computational logic, memory, sensors, etc. FIG. 4 illustrates a two-dimensional matrix of elements 400 including multiple interconnected electronics substrates 402. Again, elements 403, 404, 406, 408 are present on the various substrates and include the various elements described above, (i.e., computational elements, memory elements and functional elements). As illustrated one or more of the elements 403 may overlap or span multiple electronic substrates 402. In such an embodiment, in addition to the connectors 410 positioned at the ends of the electronic substrate 402, additional connectors or ports 420, are provided to in between the various elements (i.e., the computational elements 404, memory element 406 and other functional elements 408 as described above) along the length of the electrical substrates to reduce latency, increasing efficiency, of inter-component communication in the 2D matrix. In embodiments, junction cables 422 are provided as between the ports 420, providing an interface between one or more channels to connect two or more electronic substrates 402. Similar to the electrical substrates, the junction cables are formed from interconnect cables with one or more channels, and up to ninety nine channels or formed from printed circuits. In addition, the ports and junction cables may exhibit a flexural modulus of 0.1 GPa to 30 GPa, including all values and increments therein. Such as in the range of 0.04 GPa to 1.0 GPa, 8 GPa to 10 GPa, etc.

In the above embodiments, communication along the electronic substrate(s) is uni-directional or bi-directional depending on the configuration of the electronic substrate. To provide for communication between the components on an open ended electronic substrate, the communication must be bi-directional. On the other hand, if the electronic substrate is closed in on itself (as in a ring), communication is either unidirectional or bi-directional depending on the interconnects employed. Address codes are provided to ensure identification of the components for purposes of communication. That is, as the dies are modular, the dies may each include an address code and when positioned on a given channel (or channels), the element sends an identifying signal to the computational logic alerting the computational logic of its presence on the electronic substrate. In embodiments, after being turned on or after a given time period, the computational logic sends a query to each channel of the substrate, wherein the individual dies send in return an identifying signal, indicating they are present, what their functional capability is, or both. One or more computational elements store this information, i.e., the elements present identified by an address code, its associated channel, its associated electrical substrate (when more than one is present) and its associated functionality in memory, either in the computational element itself or in the memory element. The number of channels to which each die is connected may depend on, for example, the required bandwidth for communication.

Figure 5A:
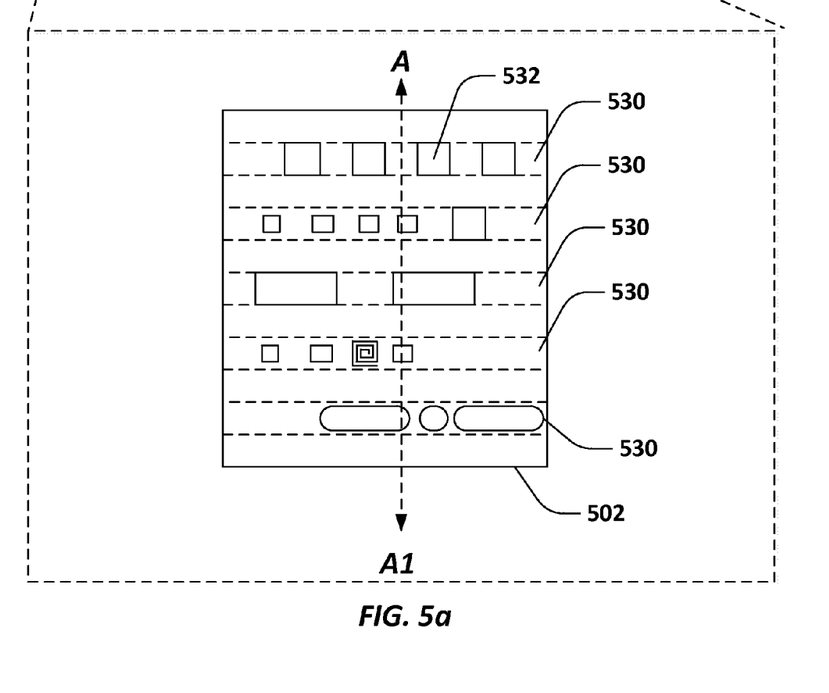
FIG. 5a illustrates a close up of an embodiment of an electrical substrate.
Figure 5B:
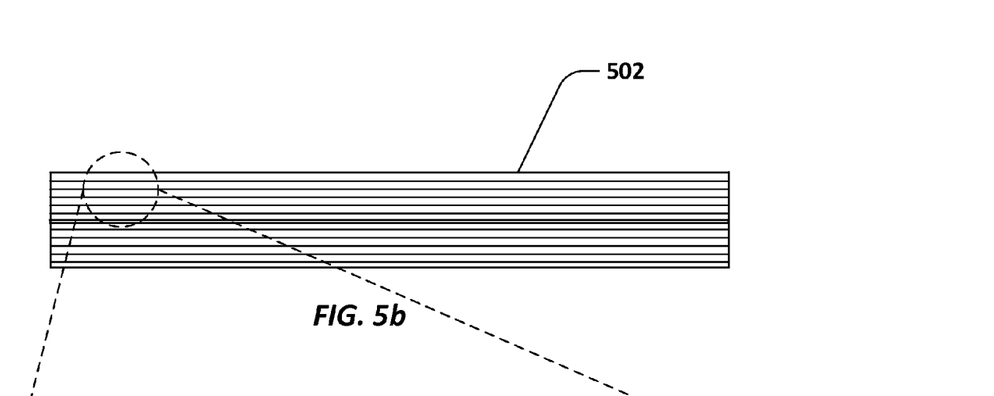
Figure 5C:
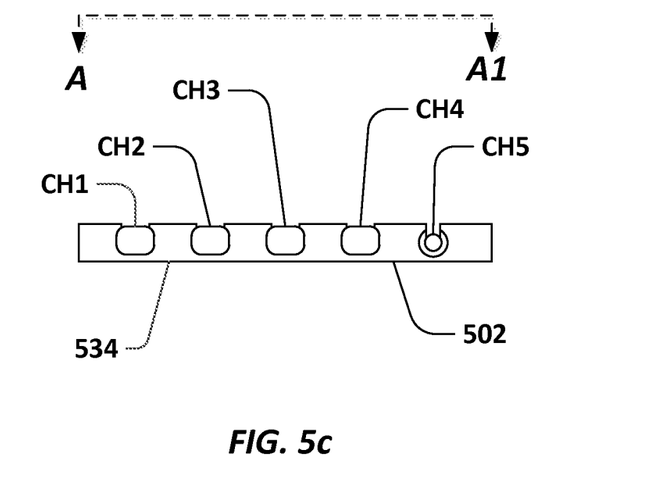

FIGS. 5a, 5b and 5c illustrate an exemplary channel configuration. FIG. 5a is a close up view of FIG. 5b illustrating a portion of electronic substrate 502. FIG. 5c illustrates cross-section A-A1 of the close-up view of FIG. 5a. The individual channels 530 are formed of electrically or optically conductive materials, such as copper, gold, or optical fiber including air-core waveguides or polymer waveguides or glass core waveguides. In the embodiment illustrated, channel 1 (CH1) and channel 3 (CH3) provide power, channel 2 (CH2) provides input/output, i.e., communication via electrical signals, channel 4 (CH4) provides either input/output, i.e., communication via electrical signals, RF communication, or other contact free or wireless proximity communication), and channel 5 (CH5) provides input/output, i.e., communication via optical signals, rather than electrical signals. Signals are understood as information regarding a state of a physical system, conveying a message, etc. With respect to optical channels, additional optical elements such as reflectors and minors, are optionally incorporated into the electrical substrate when formed.

The channels are accessible through, for example, openings 532 defined in the coating layer 534 or outer layer of the electronic substrate 502 providing physical access to the channels. In addition, openings to the optical interconnects, or channels, are shaped to allow for minimal coupling loss. Each opening can have different shapes and sizes. A number of other channel configurations are available as well. As alluded to above, up to 99 channels may be provided, wherein channels are selected from communication (input/output channels), power, RF, etc. In embodiments, at least three channels are provided, wherein at least one of the channels provides a ground, one of the channels provides power and one of the channels provides communication. Each of the various elements (i.e. computational elements, memory elements, and functional elements) are connected to one or more of the channels.

Figure 6A:
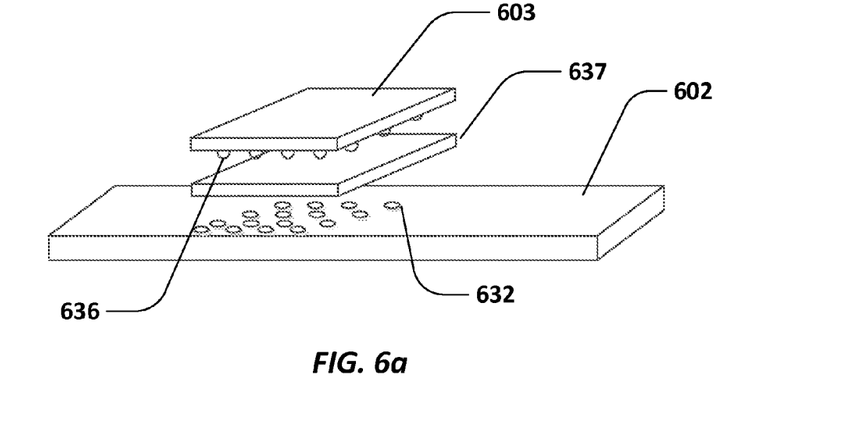
FIG. 6a illustrates an embodiment of a pre-assembled die, bonding layer and electrical substrate.
Figure 6B:
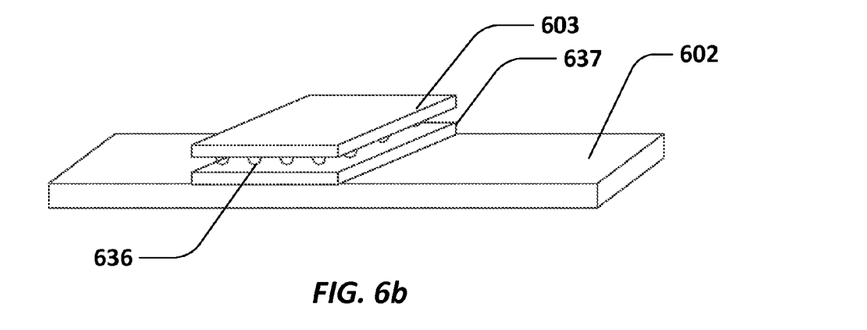
FIG. 6b illustrates an assembled die, bonding layer and electrical substrate.

The flexible computing fabric may be formed using a number of assembly processes. A general method of assembling the dies to the electronic substrates is schematically depicted in FIGS. 6a through 6b. As seen in FIG. 6a, a bonding layer 637, such as anisotropic conductive film, is provided as between contacts 636 on an element die 603, (e.g., computational elements, memory elements, functional elements such as sensors, actuators or receivers/transmitters). And, particularly, between the contacts 636 and the channels (not visible) accessible through holes 632 defined in the electronic substrate 602. Specifically, the bonding layer 637 is applied to either the dies 603 or to the electronic substrate 602. In embodiments, the bonding layer is applied before the dies are even cut. Then as illustrated in FIG. 6b, the die 603, bonding layer 637 and the electronic substrate 602 are bonded together using the application of force, thermal energy, or both.

In embodiments, the bonding layer is electrically conductive, optically conductive, both electrically conductive and optically conductive, non-conductive, or both non-conductive and optically conductive. Thus, where electrically conductive interconnects are needed to provide power (power or ground) and or communication (input or output), the bonding layer is selected from an electrically conductive solder (described further below) or polymer material. Where optically conductive interconnects are present (such as with channel 5 described in FIG. 5c) an optically transparent unfilled polymer, optically transparent polymer adhesive, or both is employed. Optically conductive may be understood as allowing at least 50% of incident light of one or more wavelengths to pass through the interconnect 637, including all values and increments from 50% to 100%.

In embodiments and as described above, the assembly process utilizes an anisotropic conductive film (ACF) to provide both the bonding layer and underfill. In addition, or alternatively to the ACF, a non-conducting film (NCF) is used as an interconnect. Further, in embodiments, sustained pressure is maintained on the ACF using mechanical clamping or using a permanent magnet interfaces. The magnets are incorporated by dispersing magnetic particles in the ACF, depositing magnetic films on the die bumps or contacts, incorporating magnetic alloys into the die bumps or contacts, or combinations thereof. Further, magnetic particles or a metallic alloy may be deposited on the channels of electronic substrate. The attraction between the magnetic particles or films provided on the die and the substrate then applies the constant pressure onto the ACF.

Figure 7A:
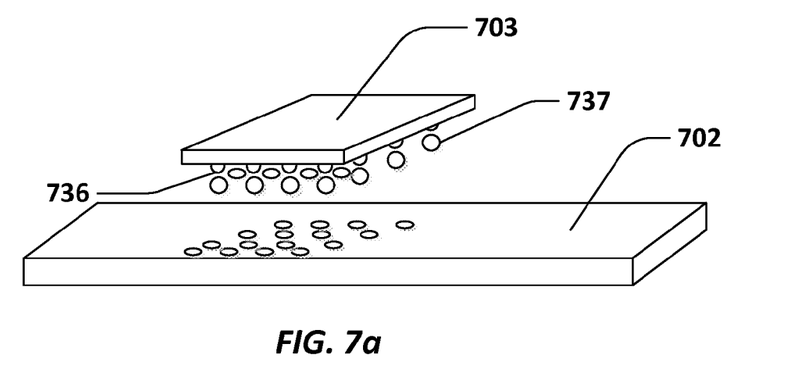
FIG. 7a illustrates another embodiment of a pre-assembled die, bonding layer and electrical substrate.
Figure 7B:
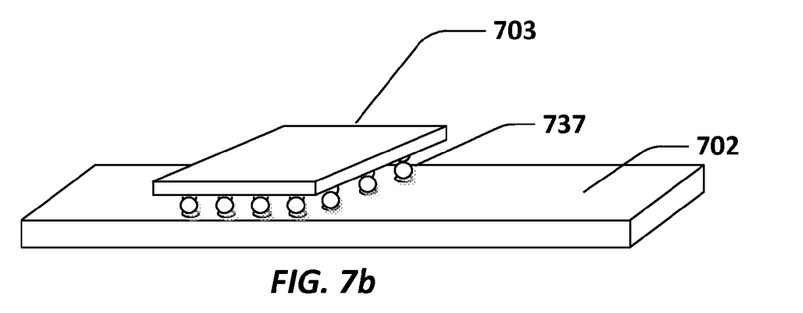
Figure 7C:
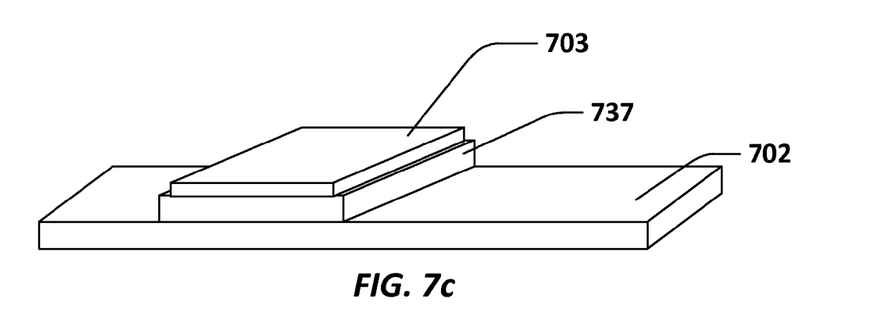
FIG. 7c illustrates the use of an underfill in the assembly of FIG. 7b.

FIGS. 7a through 7c depict a method of assembling the dies and electrical substrate using solder bumps. As seen in FIG. 7a, a bonding layer 737, including a plurality of discrete solder bumps, is provided between contacts 736 on the various element dies 703 (e.g., computational elements, memory elements, functional elements such as sensors, actuators or receivers/transmitters) and the electronic substrate 702. Specifically, the bonding layer 732 is applied to the dies before the dies are cut. The solder bumps are formed from solder exhibiting a reflow temperature 220° C., or less including all values and ranges from 100° C. to 220° C., such as 150° C. As illustrated in FIG. 7b, the dies 703, bonding layer 737, and the electronic substrate 702 are bonded together using the application of thermal energy (i.e., heat) and, optionally, force, wherein the solder is caused to reflow.

As illustrated in FIG. 7c, an underfill 738 is applied when the bonding layer leaves spaces between the die and the substrate as is the case when solder bumps 737 are utilized as a bonding layer. The underfill 738 utilizes an electrically-insulating adhesive, such as an epoxy, which flows into the spaces or interstices left between the die and the substrate. Or, alternatively, the underfill 738 is a non-conducting film applied to either the die or substrate prior to positioning the bonding layer between the substrate and the die. Optically transparent and filler free (or index-matched filler) underfill materials are used when optical interconnects are present.

The underfill 738 is then cured, such as through solvent evaporation or the application of thermal energy, i.e., heat. Again, in some embodiments, the use of magnetic particles or films is employed to improve the bonding strength of the die to the substrates. When utilized, the magnetic particles may be incorporated into the epoxy and magnetic films are coated over bumps on the die.

In addition, or alternatively, the insulative polymer provided in an electronic substrate forms an underfill. Upon mounting of the various elements or dies and reflowing solder, the insulative polymer of the electronic substrate melts and fills interstices that form in the soldering process. In such embodiments, the insulative polymer layer is a thermoplastic material which flows upon the application of heat or pressure. In such embodiments, the melt temperature of the polymer material is configured to be within +/−20° C. of the melt temperature of the solder. Furthermore, in such embodiments, the polymer material and solder are immiscible, such that the polymer material forms a matrix around the solder.

Figure 8:
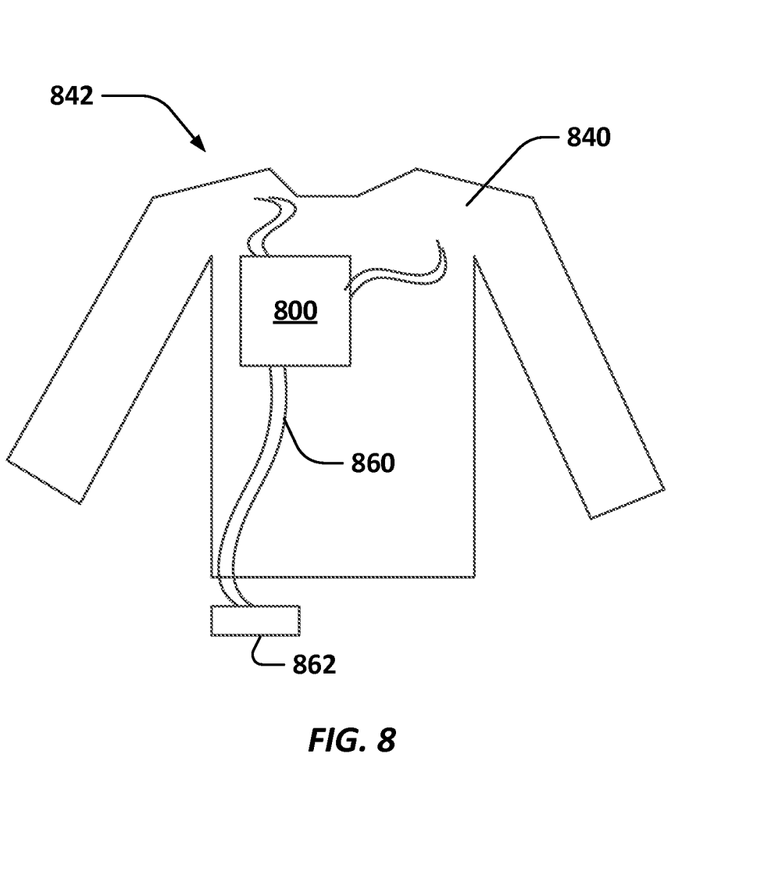
FIG. 8 illustrates an embodiment of a garment incorporating a flexible computing fabric.

The computing fabric described above may be integrated into a garment or an accessory. In embodiments, as illustrated in FIG. 8, the computing fabric 800 may be affixed chemically, mechanically or both (chemically and mechanically) directly or indirectly to the fabric 840 forming the garment 842 on either the interior or exterior surface, including for example linings, interlayers, etc. A garment is understood herein as a piece of clothing that is worn on a human or other animal and includes, shirts, coats, skirts, pants, dresses, costumes, etc. Chemically, the computing fabric 800 may be adhered to the fabric 840 using a one part or two part, thermoplastic or thermoset adhesive system. Thermoplastic adhesive systems may include hot melt systems, where the melt temperature of the adhesive is selected to be a lower temperature than the melt temperature of the fabric or any thermoplastic components in the electronic substrate, or pressure sensitive adhesives, which flow and interlock upon the application of pressure. Thermoset systems may be cured upon the application of heat, the presence of water, or the use of a curing agent. Mechanical adhesion to the fabric may be facilitated by mechanical fasteners such as those provided by sewing or welding the flexible computing fabric to the fabric forming the garment as well as the use of hook and look fasteners, wherein one portion of the fastener is secured to the computing fabric and the other portion of the fastener is secured to the garment. In further embodiments, the flexible computing fabric may be laminated to the garment. For example, an adhesive layer may be utilized between the flexible computing fabric and the garment. While it is described above that the flexible computing fabric may be applied to the garment substrate, i.e., fabric, other garment substrates may be utilized as well, such as films, netting, or other materials that may be utilized in garment construction. Furthermore, alternatively, the flexible computing fabric is incorporated into other fabric pieces, such as comforters, curtains, blankets, tents, screens, etc. The flexible computing fabric, in embodiments, exhibits a flexural modulus no greater than double the flexural modulus of the garment substrate, including from 50% of the flexural modulus of the garment substrate to 200% of the flexural modulus of the garment substrate.

Figure 9:
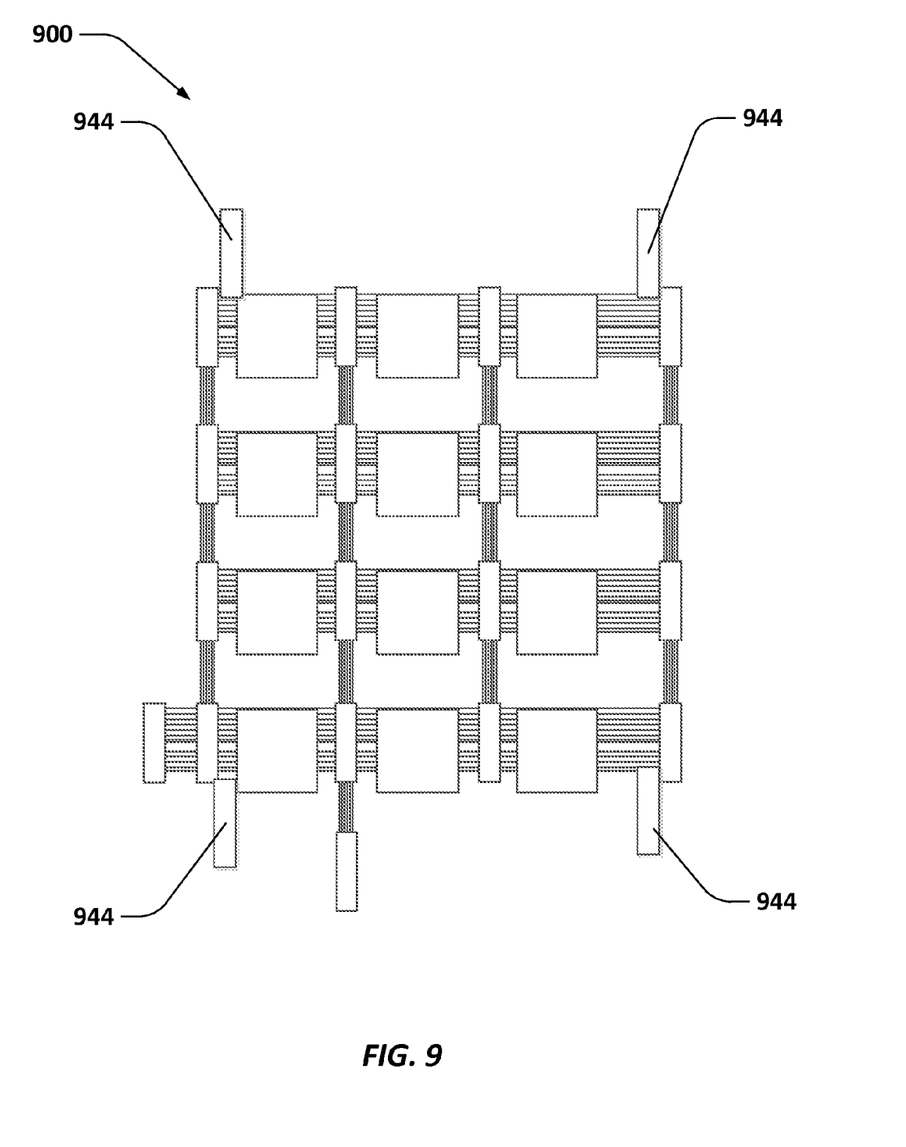
FIG. 9 illustrates an embodiment of a flexible computing fabric including fastening tabs.

In embodiments, as illustrated in FIG. 9, the flexible computing fabric 900 includes one or more tabs 944 for securing the flexible computing fabric 900 to the garment. That is, the chemical or mechanical fastener system interacts with the tabs 944 rather than with the rest of the flexible computing fabric, so as to prevent damage to any of the channels or dies in the fabric.

In addition, as alluded to above, the flexible substrate may be removably affixed to the garment. Again hook and loop fasteners are optionally employed to secure the fabric to the garment. The hook and loop fasteners are engageable and disengagable. Further, the bond provided certain adhesives may be broken via, e.g., a solvent or the application of heat.

Figure 10:
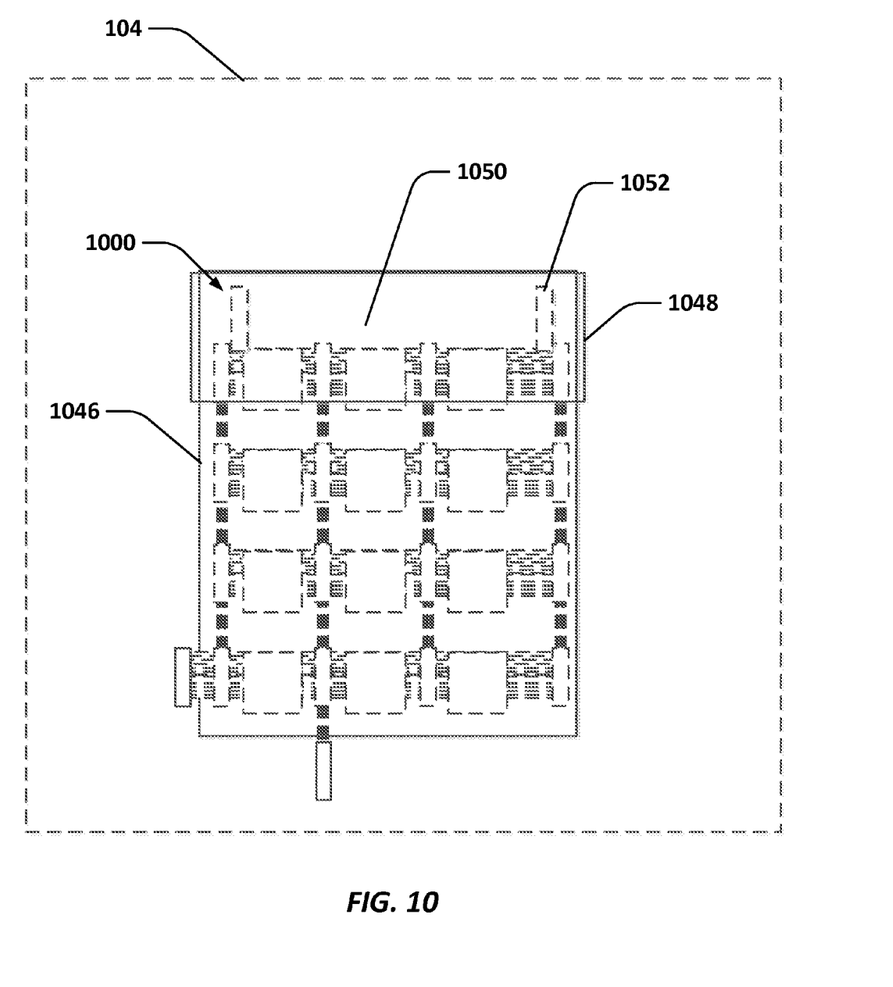
FIG. 10 illustrates an embodiment of a flexible computing fabric positioned in a pocket.

In additional embodiments, illustrated in FIG. 10, the flexible computing fabric 1000 is embedded in pockets 1046 affixed to the garment 104 on the external surface, internal surface or both. The pockets enclose at least a portion of, or all of, the flexible computing fabric 1000. Mechanically fastenable pocket flaps 1048 are optionally provided to prevent the computing fabric 1000 from falling from the pocket. In addition, the upper portion 1050 of the flexible computing fabric may be retained within the pocket by a releasable mechanical fastener 1052 (such as a hook and loop fastener system), so that the flexible computing fabric does not bunch into a ball at the bottom of the pocket.

Referring again to FIG. 8, the connectors 810 optionally include wiring 860 extending from the connectors 810 to external devices 862, such as those described above (i.e., power sources, displays and other interfaces). While not illustrated, the wiring is optionally affixed to the garment. For example, the wiring is sewed within seams or channels of the garment. Or, the wiring is adhered to the garment using a chemical adhesive. Fixing the wiring to the garment prevents the wiring from being caught and damaged, which may occur when the garment is worn or removed.

Figure 11:
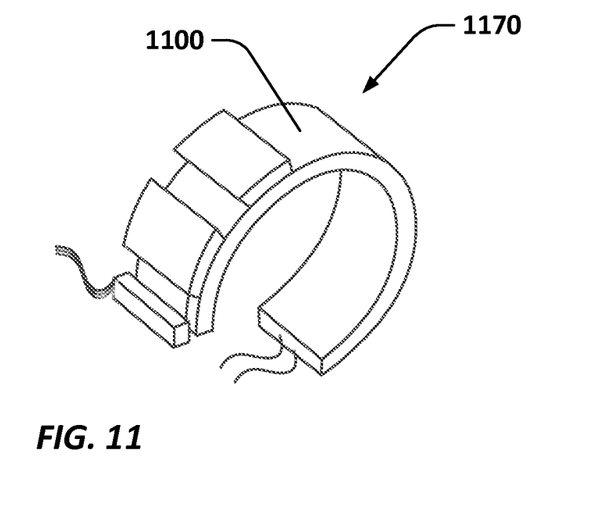
FIG. 11 illustrates an accessory incorporating a flexible computing fabric.

In further embodiments, such as illustrated in FIG. 11, the flexible computing fabric 1100 is incorporated into an accessory 1170, such as a bracelet, a headband, a necklace or a watch. An accessory is understood herein as an item that is worn in a removable manner on a person or on objects associated with a person, such as a purse, necklace, headband, socks, or other trimmings. Again, the flexible computing fabric is adhered to the accessory 1170 mechanically, chemically or both. As in the embodiments described above, the flexible computing fabric is optionally removably affixed to the accessory. Or, the flexible computing fabric may be encapsulated by the accessory.

Accordingly, the flexible computing fabric may provide a worn, connected and interfaced user experience. The components may incorporate relatively flexible, modular computational and multifunctional electronics grid, which utilizes relatively low power computational and sensory components. The flexible computing fabrics herein provide ease of integration of electronics into wearable accessories or clothing. The embodiments described herein may be relatively cost efficient and manufactured using existing processes. Furthermore, it provides modular functionality to combine diverse components into different functional units or several computing units to enhance computational power if needed, thus offering greater design flexibility.

Therefore, in one aspect the present disclosure relates to a flexible computing fabric. The flexible computing fabric includes an electronic substrate including one or more channels and further includes at least two ends. At least one computational element is mounted on the electronic substrate between the two ends and at least one functional element is mounted on the electronic substrate between the two ends. The channels form an interconnect between the elements. In addition, the electronic substrate exhibits a flexural modulus in the range of 0.1 GPa to 30 GPa.

In the above embodiment, a memory element mounted is also mounted to the electronic substrate. Further, in any of the above embodiments, a connector is mounted to the electronic substrate and configured to join at least one of the channels to an external component. In examples, the external component comprises a power supply.

In any of the above embodiments, the flexible computing fabric further includes more than one electronic substrate and at least one port mounted to each electronic substrate, wherein a junction cable connects at least two ports. In examples, at least one of the elements are mounted to at least two of the substrates.

In any of the above embodiments, the channels are optical channels. Furthermore, in any of the above embodiments, the channels are electrical channels. In addition, in any of the above embodiments, the electronic substrate includes a coating having a plurality of holes defined therein wherein the substrates are mounted.

In any of the above embodiments, a bonding layer is present between the elements and the electronic substrate. In embodiments, the bonding layer is an anisotropic conductive file. In further embodiments, where interstices are present, an underfill is located within the interstices.

In any of the above embodiments, the electronic substrate is mounted to a fabric or an accessory.

Further, in any of the above embodiments, the computational element is configured to send a query said functional element and said functional element is configured to provide an address code to said computational element.

Another aspect of the present disclosure relates to a garment. The garment includes a garment substrate and a flexible computing fabric mounted on the garment substrate. The flexible computing fabric includes the flexible computer fabric in any of the embodiments described above and includes an electronic substrate including one or more channels and at least two ends, at least one computational element mounted on the electronic substrate between the two ends and at least one functional element mounted on the electronics substrate between the two ends, wherein the channels form interconnects between the elements, and wherein the electronic substrate is flexible exhibits a flexural modulus in the range of 0.1 GPa to 30 GPa.

In the above embodiment, the garment substrate is a fabric. Further, in any of the above embodiments of a garment, the flexible computing fabric further comprises tabs and the flexible computing fabric is mounted on the garment substrate by the tabs. In addition, in any of the above embodiments of the garment, the garment further comprises a pocket affixed to the garment substrate and the flexible computing fabric is embedded in the pocket. In addition, in any of the above embodiments of the garment, the flexible computing fabric is mounted at an upper portion of the pocket.

Yet another aspect of the present disclosure relates to a method of forming a flexible computing fabric. The method includes mounting a computational element on a first channel with a bonding layer disposed between the computational element and the first channel embedded in an electronic substrate. The electronic substrate is flexible and exhibits a flexural modulus in the range of 0.1 GPa to 30 GPa and the electronic includes a coating and a plurality of holes defined in the coating exposing the first channel. The method also includes mounting a functional element on the first channel with a bonding layer disposed between the functional element and the first channel. The method further includes bonding the computational element and the first channel as well as bonding the functional element and the first channel. In addition, in the above embodiment of forming the flexible computing fabric, the bonding layer comprises an anisotropic conductive film. Further, in any of the above embodiments of forming the flexible computing fabric, the bonding comprises applying pressure to said anisotropic conductive film. Also, in any of the above embodiments of forming the flexible fabric, the bonding layer comprises a plurality of solder bumps. In addition, in any of the above embodiments of forming the flexible computing fabric the bonding comprises applying heat. Finally, in any of the above embodiments of forming the flexible fabric, the method further comprises underfilling the computational element and functional element.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A flexible computing fabric, comprising:
an electronic substrate including one or more channels, wherein said electronic substrate includes at least two ends;
at least one computational element mounted on a surface of said one or more channels of said electronic substrate between said two ends, and at least one functional element mounted on said surface of said one or more channels of said electronic substrate between said two ends, wherein said one or more channels form an interconnect between said elements;
wherein said electronic substrate is flexible and exhibits a flexural modulus in the range of 0.1 GPa to 30 GPa.

2. The flexible computing fabric of claim 1, further comprising a memory element mounted to said electronic substrate.

3. The flexible computing fabric of claim 1, further comprising a connector mounted to said electronic substrate configured to join at least one of said channels to an external component.

4. The flexible computing fabric of claim 3, wherein said external component comprises a power supply.

5. The flexible computing fabric of claim 1, further comprising:
more than one electronic substrate;
at least one port mounted to each electronic substrate; and
a junction cable connecting at least two of said ports.

6. The flexible computing fabric of claim 5, wherein at least one of said elements is mounted to at least two of said substrates.

7. The flexible computing fabric of claim 1, wherein one of said channels is an optical channel.

8. The flexible computing fabric of claim 1, wherein one of said channels is an electrical channel.

9. The flexible computing fabric of claim 1, wherein said electronic substrate includes a coating having a plurality of holes defined therein where said substrates are mounted.

10. The flexible computing fabric of claim 1, further comprising a bonding layer disposed between said elements and said electronic substrate.

11. The flexible computing fabric of claim 10, wherein said bonding layer is an anisotropic conductive film.

12. The flexible computing fabric of claim 10, further comprising one or more interstices between said electronic substrate and an underfill located within said interstices.

13. The flexible computing fabric of claim 1, wherein said electronic substrate is mounted to a fabric.

14. The flexible computing fabric of claim 1, wherein said electronic substrate is mounted to an accessory.

15. The flexible computing fabric of claim 1, wherein said computational element is configured to send a query said functional element and said functional element is configured to provide an address code to said computational element.

16. A garment, comprising:
a garment substrate; and
a flexible computing fabric mounted on said garment substrate, wherein said flexible computing fabric includes an electronic substrate including one or more channels and includes at least two ends, at least one computational element mounted on a surface of said one or more channels of said electronic substrate between said two ends and at least one functional element mounted on said surface of said one or more channels of said electronic substrate between said two ends, wherein said one or more channels form interconnects between said elements, and wherein said electronic substrate is flexible and exhibits a flexural modulus in the range of 0.1 GPa to 30 GPa.

17. The garment of claim 16, wherein said garment substrate is a fabric.

18. The garment of claim 16, wherein said flexible computing fabric further comprises tabs and said flexible computing fabric is mounted on said garment substrate by said tabs.

19. The garment of claim 16, wherein said garment further comprises a pocket affixed to said garment substrate and said flexible computing fabric is embedded in said pocket.

20. The garment of claim 19, wherein said flexible computing fabric is mounted at an upper portion of said pocket.

* * * * *